(12) United States Patent
Ziegenhagen et al.

(10) Patent No.: US 11,508,601 B2
(45) Date of Patent: **\*Nov. 22, 2022**

(54) ELECTROSTATIC HOLDING APPARATUS WITH A LAYERED COMPOSITE ELECTRODE DEVICE AND METHOD FOR THE PRODUCTION THEREOF

(71) Applicant: ASML Netherlands B.V., Veldhoven (NL)

(72) Inventors: Lars Ziegenhagen, Berlin (DE); Simon Halm, Berlin (DE)

(73) Assignee: ASML Netherlands B.V., Veldhoven (NL)

( * ) Notice: Subject to any disclaimer, the term of this patent is extended or adjusted under 35 U.S.C. 154(b) by 154 days.

This patent is subject to a terminal disclaimer.

(21) Appl. No.: 16/834,597

(22) Filed: Mar. 30, 2020

(65) Prior Publication Data

US 2020/0321233 A1    Oct. 8, 2020

(30) Foreign Application Priority Data

Apr. 4, 2019    (DE) .......................... 102019108855.0

(51) Int. Cl.
H01L 21/683 (2006.01)
G03F 7/20 (2006.01)
(Continued)

(52) U.S. Cl.
CPC ...... H01L 21/6833 (2013.01); G03F 7/70708 (2013.01); H01L 21/6875 (2013.01);
(Continued)

(58) Field of Classification Search
CPC . G03F 7/70708; H02N 13/00; H01L 21/6833; H01L 21/6875; H01L 21/68757; H01L 21/6831
(Continued)

(56) References Cited

U.S. PATENT DOCUMENTS 4,502,094 A * 2/1985 Lewin ................. H01L 21/6831
118/500
9,673,079 B2 6/2017 Baldus
(Continued)

FOREIGN PATENT DOCUMENTS

DE    102018116463 A1    1/2020
JP     2010161319 A      7/2010
(Continued)

OTHER PUBLICATIONS

English Abstract for JP 2010161319 A (2010).

*Primary Examiner* — Charlee J. C. Bennett
(74) *Attorney, Agent, or Firm* — Caesar Rivise, PC (57) ABSTRACT

Holding apparatus 100 for electrostatic holding component 1 (e.g., semiconductor wafer), includes base body 10 with at least one plate 10A, protruding burls 11 on upper side of plate and end faces 12 of which span a burls support plane for supporting component, and electrode device 20 in layered form in spacings between burls and insulator layer 21 which is connected to plate, dielectric layer 23 of inorganic dielectric and electrode layer 22 between insulator and dielectric layers. Between burls support plane and dielectric layer upper side, predetermined gap spacing A is set. Electrode device has openings 24 and is on plate upper side between burls, which protrude therethrough. Insulator layer includes inorganic dielectric and is connected with adhesive 13 to base body upper side between burls. Electrode device is embedded in adhesive. Spacing between burls and electrode device is filled with adhesive. A production method is also described.

15 Claims, 3 Drawing Sheets

(51) Int. Cl.
*H02N 13/00* (2006.01)
*H01L 21/687* (2006.01)

(52) U.S. Cl.
CPC ....... *H01L 21/68757* (2013.01); *H02N 13/00* (2013.01); *H01L 21/6831* (2013.01)

(58) Field of Classification Search
USPC ......................................................... 118/728
See application file for complete search history.

(56) References Cited

U.S. PATENT DOCUMENTS

| | | |
|---|---|---|
| 9,798,251 B2 | 10/2017 | Lafarre et al. |
| 2009/0079525 A1 | 3/2009 | Sijben |
| 2012/0236458 A1 | 9/2012 | Ingwersen |
| 2012/0274920 A1 | 11/2012 | Bex et al. |
| 2013/0308116 A1 | 11/2013 | Helmus et al. |
| 2015/0348815 A1* | 12/2015 | Baldus ................ H01L 21/6833 29/846 |
| 2015/0348816 A1 | 12/2015 | Stein |
| 2016/0018744 A1* | 1/2016 | Lafarre ............... G03F 7/70716 156/60 |
| 2016/0354864 A1 | 12/2016 | Hammer et al. |
| 2018/0047605 A1 | 2/2018 | Gratrix et al. |
| 2020/0013660 A1* | 1/2020 | Halm .................. H01L 21/6833 |
| 2021/0114101 A1* | 4/2021 | Lafarre ..................... G03F 7/20 |

FOREIGN PATENT DOCUMENTS

| | | |
|---|---|---|
| JP | 2016519332 A | 6/2016 |
| WO | 2011053145 A1 | 5/2011 |
| WO | 2012005294 A1 | 1/2012 |

* cited by examiner

ELECTROSTATIC HOLDING APPARATUS WITH A LAYERED COMPOSITE ELECTRODE DEVICE AND METHOD FOR THE PRODUCTION THEREOF

CROSS-REFERENCE TO RELATED APPLICATIONS

This application claims priority to DE 102019108855.0, filed Apr. 4, 2019, the contents of which are incorporated herein by reference in their entireties for all purpose

FIELD OF THE INVENTION

The invention relates to a holding apparatus for the electrostatic holding of a component, in particular a semiconductor wafer. The invention also relates to a method for producing the holding apparatus. Applications of the invention are in the provision of devices or tools for holding components with electrostatic forces, in particular for holding semiconductor wafers, for example, silicon wafers.

BACKGROUND OF THE INVENTION

An electrostatic holding apparatus which is also designated an electrostatic clamping apparatus, electrostatic clamp (ESC) or electrostatic chuck, in general has a plate-shaped base body for receiving the component and an electrode device for generating an electrostatic holding force or, in relation to the area, an electrostatic clamping pressure. The base body can be configured, in general, integrally from a plate or multi-layered from a plurality of plates. On at least one surface, the base body is provided with protruding burls, the end faces of which generate a burls support plane. The burls support plane defines the support area for the component that is held.

The electrode device comprises one or more electrodes with which through application of an electric voltage, the electrostatic clamping pressure is generated. The electrostatic clamping pressure depends, in particular, upon the voltage, the distance of the electrodes from the burls support plane and on the dielectric properties of the material composition at this distance. The latter comprises the dielectric above the electrodes with a defined layer thickness and a relative permittivity $\varepsilon_{r,d}$ and the free gap spacing filled with a gas of permittivity $\varepsilon_{r,g}$ between the burls support plane and the upper side of the holding apparatus between the burls. Since the ratio $\varepsilon_{r,d}/\varepsilon_{r,g}$ is typically significantly greater than 1, the electrostatic clamping pressure is typically substantially co-determined by the gap spacing. For the achievement of a high and homogeneous clamping pressure, there is therefore a particular interest in a gap spacing that is as small and as constant as possible over the area of the holding apparatus.

A distinction can be made between two variants of electrostatic clamps. In a first variant, the insulator, electrode and dielectric are applied onto one another over the full area as layers on a base body. Since the material of the base body in this variant does not protrude through the individual layers, the burls on the clamp surface must be produced from the material of the dielectric, which is usually sensitive glass. If the burls consist of a soft dielectric material such as, for example, glass, they have a lower wear resistance than, for example, ceramic burls. In this case, additional wear prevention layers are required which increase the production effort and require renewal in regular cycles.

In the second variant to which the present invention relates, the burls are formed integrally as part of the base body and the insulator layer is arranged between the burls together with the electrodes and the dielectric as a layered composite. If a material that is significantly harder than glass, for example SiSiC, is selected for the base body, the mechanical strength of the burls and thus of the support area is substantially improved. However, the complex multilayered structure of the electrode device has previously been associated with a long, almost entirely serial process chain with high costs, a restricted yield, a high degree of effort and high costs due to post-processing in the production, and with long delivery times.

In US 2015/0348816 A1, an apparatus according to the aforementioned first variant of electrostatic clamps is described. Herein, a dielectric disk coated with an electrode is adhesively bonded over the full area onto a base body. The adhesive is selected such that, apart from its adhesive properties, it also serves as an insulator between the base body and the electrode. The burls support plane is introduced into the dielectric in the device described in US 2015/0348816 A1. In this apparatus, the full-area adhesive bonding of the dielectric disk, whereby the adhesive is also situated under the individual burls, can have disadvantageous effects. A shrinking or ageing of the adhesive polymer can lead to a position change of the burls in the z-direction and thus disadvantageously change the evenness on the clamp support area. Furthermore, in US 2015/0348816 A1, it is described that the adhesive evens out unevennesses between the dielectric and the base body. This can have the result, however, that under the individual burls, different adhesive layer thicknesses occur and thus the compressibility of the individual burls varies, which can also have an effect on the evenness of the support area during later operation of the device and the action of a clamping pressure.

A holding apparatus according to the aforementioned second variant of electrostatic clamps wherein the electrode device is not integrated into the base body, but is arranged on its surface between the burls (burl bottom) is described, for example, in US 2009/0079525 A1 and in US 2013/0308116 A1. In this case, the electrode device comprises a layered structure between adjacent burls with a bottom plastics insulating layer, in the upper side of which the electrodes are integrated, and a dielectric layer made of a plastics or glass, which extends over the insulating layer with the electrode. This configuration represents a suggestion for the arrangement of the electrodes between the burls, although no methods are disclosed as to how the layered structure is to be produced on a holding apparatus for practical applications with, for example, several thousand burls. In particular, it is disadvantageous, that no setting of the distance of the electrodes from the burls support plane or of the gap spacing is provided, so that the electrostatic clamping pressure can vary over the area of the holding apparatus.

From U.S. Pat. No. 9,673,079 B1, it is known, for the production of an electrostatic holding apparatus, to provide the electrode device as a separate component with a self-supporting silicon plate, electrode layers on the silicon plate and a covering SiN dielectric layer. The silicon plate has holes for receiving the burls of the base body. For the connection of the electrode device to the base body, the silicon plate is adhesively bonded onto the base body, wherein the burls protrude through the holes of the electrode device. With this method, particular advantages arise from the separate production of the electrode device and its simple connection to the base body. It can, however, be disadvantageous that, for example, through thickness variations in the adhesive connection between the electrode device and the base body, variations of the gap spacing can arise above the electrode device. Furthermore, it is required that the silicon plate is as thin as possible or the burl height is as great as possible, which leads to a complex time-consuming processing.

According to US 2012/0274920 A1, it is proposed to produce the electrode device with thin film technology in the spacings between the burls. Firstly, a planarization layer is formed on the base body between the burls, on which a polymer or $SiO_x$-based insulator layer, the electrode layer and a polymer or $SiO_x$-based dielectric layer are deposited. With this technology, the planarization layer permits a planarizing of the electrode device. It is disadvantageous, however, that even in this case, through variations in the thin-film deposition, variations of the gap spacing and thus of the electrostatic clamping pressure arise. Furthermore, the thin layers are sensitive to damage on use of the holding apparatus.

In order to prevent variations of the gap spacing, it is proposed in US 2018/0047605 A1 to form the electrode device in the spaces between the burls by means of a polymer-based insulator layer, electrode layers on the insulator layer and a covering polymer-based dielectric layer. Variations of the gap spacing should be excluded in that the upper sides of the insulating and dielectric layers are adjusted before their hardening, in each case, with a reference tool. With this technology, variations of the holding forces through variations of the gap spacing are prevented. A disadvantage arises, however, from the large number of successive operations to be carried out in the production of the holding apparatus. A further more important disadvantage results from the use of polymers for the formation of the insulator and dielectric layers. Polymer plastics have a limited chemical and/or physical resistance under the conditions of use of electrostatic holding apparatuses, in particular in the processing of semiconductor wafers. Unwanted substances can be released and/or ageing processes of the polymers can restrict the working life of the holding apparatus.

In the German patent application DE 10 2018 116 463.7 (not yet published at the priority date of the present specification), a further method for producing a holding apparatus according to the above second variant is described. Thereby, an electrode device is produced in that a dielectric disk which carries an electrode layer is adhesively bonded onto the upper side of the base body and is subsequently thinned for setting the thickness of the finished dielectric layer and the gap spacing between the burls support plane and the upper side of the dielectric layer. This method advantageously enables the setting of a desired gap spacing. However, since the adhesive forms the insulator layer between the electrode layer and the base body, disadvantages can arise with regard to the reliability of the electrical insulation. For example, inhomogeneities in the adhesive, for example particles, can impair the dielectric strength of the insulator layer.

Finally, a general disadvantage of conventional holding apparatuses lies therein that the function of the holding apparatus can conventionally only be tested on the finished product in that the electrode device has a working voltage applied to it and the holding force achieved is measured. In the event of functional errors or insufficient holding force, a correction is typically not possible, so that the holding apparatus must be discarded as a reject.

The problems mentioned occur not only in holding apparatuses for holding semiconductor wafers, but also in other uses, for example, in holding apparatuses for holding glass plates.

The objective of the invention is to provide an improved holding apparatus for electrostatic holding of a component, in particular a semiconductor wafer, with which disadvantages of conventional techniques are avoided. The holding apparatus is intended, in particular, to enable variations of the gap spacing along the burls support plane to be minimized or completely eliminated, disadvantages from the use of polymer plastics to be minimized or completely eliminated, the holding apparatus to be produced with a simple method, and/or the holding apparatus to be produced with a reduced reject rate. It is a further objective of the invention to provide an improved method for producing an electrostatic holding apparatus, with which disadvantages of the conventional techniques are overcome. The method is intended to be distinguished by a simplified production of the holding apparatus, to simplify a parallelizing of production steps, reducing a reject quota and/or enabling a reliable setting of the gap spacing along the burls support plane.

These objectives are achieved by an electrostatic holding apparatus and a method for producing an electrostatic holding apparatus of the invention.

BRIEF SUMMARY OF THE INVENTION

According to a first general aspect of the invention, the aforementioned objective is achieved by an electrostatic holding apparatus for the electrostatic holding of a component, in particular a semiconductor wafer, for example, a silicon wafer, which comprises a plate-shaped, planar base body and an electrode device. The base body is composed of one or more base body plates and is provided on a surface of at least one of the base body plates with protruding burls. Planar end faces of the burls are arranged in a common burls support plane. During operation of the holding apparatus, the component to be held lies on the end faces of the burls.

The electrode device is arranged in layered form in spaces between the burls, i.e. on the burl bottom. For this purpose, the electrode device has a plurality of openings and it is arranged along the lateral extent of the upper side of the uppermost base body plate between the burls so that the burls protrude through the openings. The electrode device comprises a layered arrangement of an insulator layer which is connected to the base body plate, an electrode layer and a dielectric layer made from an inorganic dielectric.

The electrode layer comprises a uniform electrode section or a plurality of electrode sections separated from one another which correspondingly form one or more electrodes. The electrode layer is arranged between the insulator layer and the dielectric layer, i.e. the insulator layer and the dielectric layer enclose the electrode layer perpendicularly to its extent on both sides.

The perpendicular distance between the upper side of the holding apparatus between the burls, in particular between the upper side (i.e. the side facing away from the base body) of the dielectric layer, and the burls support plane constitutes the gap spacing of the holding apparatus. The gap spacing is, in particular, the perpendicular distance between the uppermost, exposed surface of the dielectric layer (or an optional further layer provided thereon) and the surface of the held component facing toward the base body, i.e. the plane of the end faces of the burls (or an optional further layer provided thereon).

According to the invention, the insulator layer comprises an inorganic dielectric. The insulator layer forms the lowest layer of the electrode device, i.e. facing to the base body. Along the insulator layer, the electrode device is connected by means of an adhesive to the upper side of the base body. Advantageously, the electrode layer is enclosed on both sides by inorganic dielectrics. The materials of the insulator layer and of the dielectric layer can be selected to be the same or different.

The use of inorganic dielectrics, in particular, the provision of the insulator layer by an inorganic dielectric, has several advantages. Firstly, the dielectric properties of inorganic dielectrics, for example glass, are well known. In particular, alkali ion-free dielectrics, for example alkali ion-free glasses, are available. Alkali ion-free glasses advantageously enable a rapid switching and recharging of the holding apparatus while avoiding electric relaxation effects. Furthermore, the dielectric layers of the electrode device constitute a covering of the adhesive layer that is formed between the insulator layer and the base body. Advantageously, thereby the adhesive is protected from chemical and/or physical influences during the operation of the holding apparatus. Disadvantages, such as occur on use of polymer plastics, for example, according to US 2018/0047605 A1, can be prevented.

A further advantage of the invention lies therein that through the provision of the insulator layer from an inorganic dielectric, the thickness of the adhesive layer can be reduced in comparison with the plastics insulator layer according to the German patent application DE 10 2018 116 463.7, so that possible influences of the adhesive on the electrical properties of the holding apparatus and the holding force are minimized or precluded.

Finally, it is particularly advantageous that, by means of the insulator layer provided according to the invention, the functions of the electrical insulation and the fixing on the base body, as were fulfilled in the conventional holding apparatus by the plastics insulator layer together, are separated. The insulator layer can be optimized for the electrical insulation, whereas the adhesive can be selected with regard to optimum adhesive strength and durability. At the same time, as described with further details given below in relation to the method according to the invention, the electrode device can be produced and tested separately from the base body, so that the rejection quota due to faulty electrode devices can be reduced.

Furthermore, according to the invention, the electrode device is embedded in the adhesive, whereby the adhesive is arranged laterally, i.e. in directions parallel to the upper side of the base body, between the burls and the electrode device. The embedding of the electrode device means that it protrudes in the thickness direction into the adhesive layer for connecting to the base body. The embedding enables the gap spacing of the holding apparatus to be formed independently of the thickness of the electrode device, and in particular a production of the holding apparatus with a precisely set gap spacing.

The holding apparatus according to the invention also has the following advantages. The homogeneity of the clamping pressure required particularly in the processing of semiconductor components is improved over conventional techniques. Inherent limitations, for example, of the conventionally used thin-film techniques with regard to the achievable global and local layer thickness homogeneity on the required workpiece diameter and the additional necessity for the equalization of existing unevennesses of the base body relative to the plane of the burl surfaces are overcome.

Furthermore, functional restrictions on conventional holding apparatuses with regard to the chemical and physical durability of plastics, for example, in relation to cleaning media, air humidity, EUV radiation and local mechanical loading are overcome and a better definition of the dielectric properties which define the clamping pressure dynamics is achieved.

The base body of the holding apparatus according to the invention is preferably configured so that a burl bottom is formed planar in the spacings between the burls and, in particular, extends parallel to the burls support plane so that by means of the adhesive connection of the insulator layer to the base body, undesirable extended hollow spaces are prevented. Particularly preferably, the burl bottom has a structure which promotes the adhesion between the base body and the insulator layer. For this purpose, the base body can have a roughness in the spacings between the burls with unevennesses the height of which above the mean level of the burl bottom is significantly less than the thickness of the adhesive layer. Preferably, the unevennesses are smaller than 10% of the thickness of the adhesive layer. Alternatively or additionally, the burl bottom can have adhesion-promoting depressions (e.g. pores or gaps) in the base body. The depressions can reach deeper into the base body than the thickness of the adhesive layer. During production of the holding apparatus, the adhesive can flow into the depressions and fill them, so that the vacuum stability of the base body is not impaired by the depressions.

According to a preferred embodiment of the invention, the surface of the adhesive in the spacings between the burls and the electrode device and the surface of the dielectric layer between the burls are formed aligned with one another. Advantageously, therefore, the gap spacing between the burls support plane and the surface between the burls can be uniformly formed. Steps in the surroundings of the burls can be prevented so that undesirable collections of particles can also be minimized.

The adhesive with which the electrode device, in particular, the insulator layer is connected to the base body is preferably a curable plastic the state of which is settable as a flowable or a curable state. The plastics material is, in particular, curable thermally and/or radiation-induced and/or solvent-induced. According to preferred variants, benzocyclobutene (BCB), prepolymerized BCB, a parylene plastics material, a polyimide plastics material and/or a polyethylene terephthalate plastics material can be used as the adhesive.

According to a further advantageous embodiment of the invention, the electrode layer is electrically insulated by insulation sections between the insulator layer and the dielectric layer at the lateral edges of the electrode layer towards the openings through which the burls protrude. The insulation sections comprise edge regions of the electrode device in which the insulator layer and the dielectric layer directly adjoin one another or in which between the insulator layer and the dielectric layer, a layer of electrically insulating material is formed. The insulation sections can be formed, for example, by a structured (masked) deposition of the material of the electrode layer and/or an etching method, so that the desired edge regions remain uncovered. Preferably, however, the layer of electrically insulating material is formed by a locally delimited conversion of the material of the electrode layer, as described below with further details. Advantageously, with the insulation sections, electrodes with different potential to one another and to the surroundings, in particular the burls, can be separated or electrically insulated.

If the electrode layer comprises a plurality of electrically separated electrode sections, the aforementioned insulation sections can also be formed between the electrode sections with a separation from the edges of the electrode device.

According to a further preferred embodiment of the invention, the base body, in particular, its uppermost base body plate provided with the burls, comprises Si-infiltrated SiC (SiSiC). SiSiC is a ceramic which, due to its high shape-holding capability and temperature stability has particular advantages for use in an electrostatic holding apparatus. Particularly preferably, the base body can have a carbon enrichment on the burl bottom. Advantageously thereby, the adhesion between the base body and the adhesive is improved. The SiC enrichment can be achieved, for example, by an Si removal by means of a laser irradiation. Particularly preferably, the burls are integrally connected to the uppermost base body plate, in particular, made from the same material as the base body plate.

Advantageously, different materials for forming the electrode layer are available. This comprises a metal, a metal alloy, a semiconductor material or an electrically conductive ceramic material. If the electrode layer comprises, in particular, chromium, titanium and/or aluminum, particular advantages arise for the locally delimited, radiation-induced conversion of the electrode layer to form the insulation sections.

According to another advantageous embodiment of the invention, a cover layer can be provided on the burls, which covers the end faces of the burls and can optionally reach to the adhesive or even to edge sections of the dielectric layer. The cover layer is preferably formed from DLC (diamond-like carbon) and/or a nitride compound. Advantageously, it enables an improvement of the friction and wear properties of the holding apparatus, an improvement of the reproducibility of the component placement and of the placement safety of components onto the burls and/or a physical protection of the plastic material of the insulator layer against physical and/or chemical environmental influences, for example, EUV radiation during the use of the holding apparatus, or cleaning agents.

The durability and stability of the electrode device can be improved according to a further advantageous embodiment of the invention if the insulator layer has an adhesion-promoting surface via which the insulator layer adjoins the adhesive. The adhesion-promoting surface preferably comprises an adhesion promoter layer, for example, made of $Si_3N_4$ or SiC or a commercially available adhesion promoter suitable for the adhesive being used (e.g. the product with the trade name AP300 for the adhesive BCB). Alternatively or additionally, the adhesion-promoting surface can be provided by a pre-treatment of the insulator layer such as, for example, the setting of a pre-determined roughness by means of laser irradiation.

According to a second general aspect of the invention, the aforementioned objective is achieved by means of a method for producing an electrostatic holding apparatus wherein a plate-shaped base body with a plurality of protruding burls is provided, the planar end faces of which generate a burls support plane for a component, in particular a semiconductor wafer, to be held, and an electrode device is produced in layered form in spacings between the burls with an insulator layer on the burl bottom, an electrode layer and a dielectric layer. The electrode layer is arranged between the insulator and dielectric layers. The electrode device is produced so that between the burls support plane and the upper side of the dielectric layer, a pre-determined gap spacing is set. The electrode device has a plurality of openings through which the burls protrude. Preferably, the holding apparatus according to the first general aspect of the invention is produced with the method according to the invention.

According to the invention, the production of the electrode device comprises the following steps. Firstly, the production of a composite of an insulator disk and a dielectric disk takes place with the electrode layer arranged between the insulator disk and the dielectric disk. The insulator disk and the dielectric disk are preferably each a shape-holding plate of an inorganic dielectric material. The electrode layer is deposited, for example, by vacuum deposition onto at least one of the plates over the whole surface or structured with a masking method. The insulator disk and the dielectric disk are joined to one another, for example, by anodic bonding. Depressions are sunk into the composite from the side of the insulator disk, said depressions forming the openings in the electrode device and the size and position thereof are selected for receiving the burls. The depressions are blind holes which extend as far as into the dielectric disk. The bottoms of the depressions can be planar or provided with projections.

Subsequently, an application of an adhesive on the upper side of the at least one base body plate of the base body and/or the surface of the insulator disk takes place and a placement of the composite on the dielectric disk and the insulator disk on the base body takes place, so that the burls extend into the depressions through the insulator disk and the dielectric disk lies with the bottoms of the depressions on the end faces of the burls. Thereby, the electrode device is embedded in the adhesive, except at the upper surface of the dielectric disk. In each opening, a gap between the burl and the inner edge of the electrode device is filled with the adhesive. By means of a hardening of the adhesive, the composite of the dielectric disk and the insulator disk is joined to the base body. The hardening of the adhesive to join the insulator layer to the base body comprises, for example, a heat treatment and/or a radiation treatment. Thereafter, for the formation of the dielectric layer, a thinning of the dielectric disk takes place until the desired gap spacing is set.

The method according to the invention has the advantage that by means of the alignment of the dielectric disk relative to the burls support plane, the reliable setting of the gap spacing is simplified. The design of the openings in the dielectric disk offers several advantages.

Firstly, production-related deviations between the arrangement of the burls and the arrangement of the openings can easily be tolerated by sufficiently large openings. Secondly, the openings enable the accommodation of superfluous plastics material in the formation of the insulator layer.

The method according to the invention is advantageously distinguished by a simplified process chain which results in significantly reduced manufacturing costs and a significantly shortened delivery period. Advantageously, the base body with burls, for example, made of ceramic material with a high wear resistance and low production and refurbishment effort can be used. Reprocessing costs due to possible production errors are significantly reduced. Furthermore, through the use of the inorganic insulator and dielectric layers, the advantageous properties of inorganic dielectrics, in particular glass can be utilized, for example, for the rapid switching of holding forces.

The method according to the invention further possesses the particular advantage that the composite of the insulator disk and the dielectric disk represents a pre-product of the electrode device, wherein the insulator disk is provided for the formation of the insulator layer and the dielectric disk is provided for the formation of the dielectric layer. The composite can be produced separately from the base body, so that the production of the holding apparatus can be parallelized. Furthermore, the composite of the insulator disk and the dielectric disk is shape-holding and mechanically stable. It has the functionality of an electrostatic clamp and permits testing of the holding function through the application of an electric voltage to the electrode layer. Since the dielectric disk still has a greater thickness than the dielectric layer in the finished holding apparatus, the test takes place with a higher test voltage as compared with the operating voltage of the holding apparatus.

The thickness of the insulator disk can be selected so that the insulator disk can be used as the insulator layer without further thinning. In practice, however, according to a preferred embodiment of the invention, it is advantageous initially to use an insulator disk with a greater thickness and subsequently to thin it in order to set the desired thickness of the insulator layer.

According to a further advantageous embodiment of the invention, insulation sections are formed in the electrode device in the surroundings of the openings, so that the electrode layer is electrically insulated from the openings by the insulation sections. The creation of the insulation sections preferably takes place by means of a local thermal conversion of the electrode layer to an electrically insulating material, for example, with the method described in US 2012/0 236 458 A1. The local thermal conversion of the electrode layer can take place before or after the deepening of the depressions into the composite of the insulator disk and the dielectric disk.

Preferably, the thinning of the dielectric disk takes place with a two-stage process, wherein, in a first phase, for example, by means of a grinding and/or polishing method, the dielectric disk is eroded until the end faces of the burls are uncovered. Since the burls are formed of a material such as, for example, SiSiC which is harder than the dielectric of the dielectric disk, the burls can be used as a reference for the thinning of the dielectric disk in the first phase. Subsequently, in a second phase, the use of an etching process takes place in order to adjust the gap spacing. The inventors have discovered that the subsequent thinning of the dielectric disk is advantageously possible with such a homogeneity that the gap spacing can be set to be constant over the whole area of the base body.

Finally, according to a further variant of the invention, a removal of adhesive residues in the gap between the burls and the electrode device can be provided, until the surfaces of the adhesive and the dielectric layer between the burls are formed aligned with one another.

BRIEF DESCRIPTION OF THE DRAWINGS

Further details and advantages of the invention will now be described making reference to the accompanying drawings. In the drawings show.

DETAILED DESCRIPTION OF PREFERRED EMBODIMENTS

Preferred embodiments of the invention are described below making exemplary reference to features of an electrostatic holding apparatus for silicon wafers, wherein the electrostatic holding apparatus is shown schematically and not to scale. The implementation of the invention is not restricted to this use. Other uses of the holding apparatus are possible, for example, for the holding of glass plates with metal coatings, or exposure masks, wherein for other uses, the form of the base body, in particular the burls, the materials and the dimensions of the electrode device are adapted to the specific requirements. Deviating from the illustration, the base body can comprise a single plate or can be made multilayered from a plurality of sub-plates. Furthermore, for practical applications of the holding apparatus in the handling of semiconductor wafers, the base body is provided on both sides with burls and each provided with an electrode device. Details of the specific configuration of the electrodes along the holding area of the holding apparatus are not described, since they are known per se from conventional holding apparatuses and can be selected dependent upon the specific task of the holding apparatus. Finally, the drawings do not provide an illustration to scale of holding apparatuses, but rather clarify, in particular, the provision of the electrode device in the spacings between the burls of the base body.

The structure of the base body of the holding apparatus can be selected as known per se from conventional holding apparatuses. The holding apparatus can be configured, for example, as monopolar (with a single electrode section) or bipolar holding apparatus (with two or more electrode sections). Details of the tempering of the holding apparatus and of the use of electric voltages for generating electrostatic holding forces are not described since they are per se known from conventional holding apparatuses.

Figure 1:
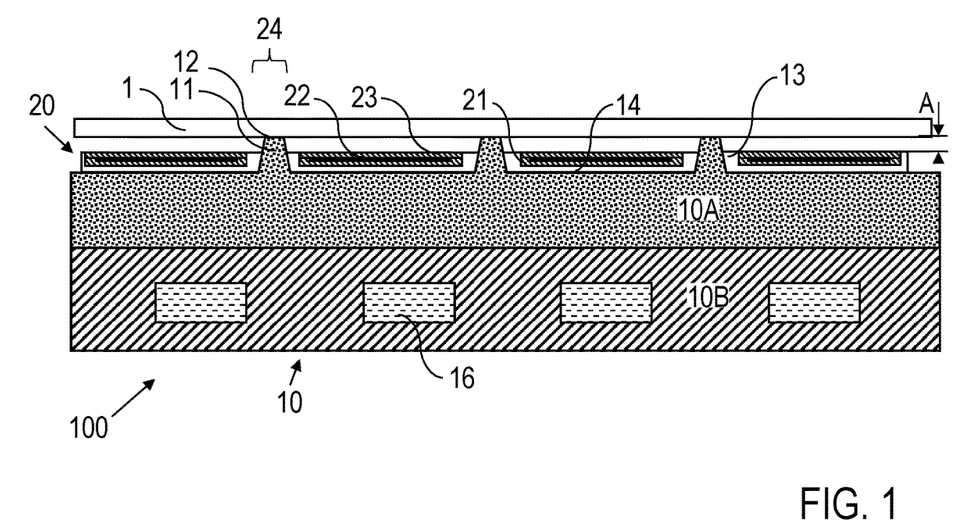
FIG. 1 a schematic sectional view of an embodiment of the electrostatic holding apparatus according to the invention.
Figure 2:
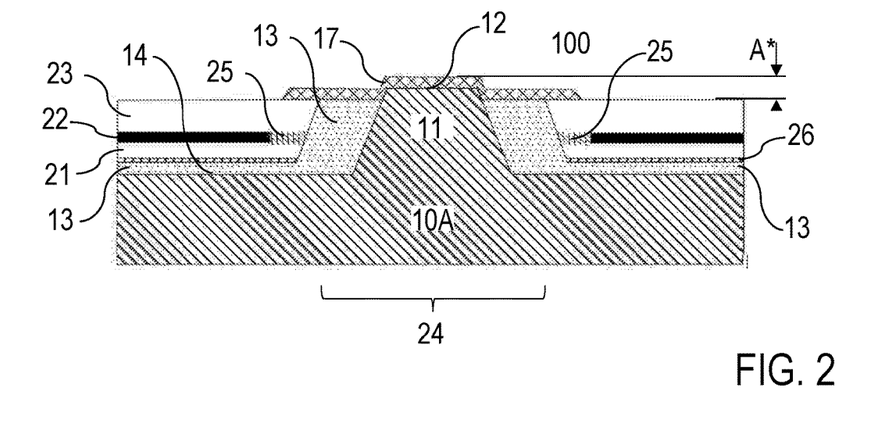
FIG. 2 a schematic sectional view of further details of a part of the electrostatic holding apparatus according to the invention in the surrounding of a burl.

FIG. 1 illustrates a schematic sectional view of a preferred embodiment of the electrostatic holding apparatus 100 according to the invention which is configured for uses in semiconductor processing. The holding apparatus 100 comprises a base body 10 and an electrode device 20. The base body 10 is constructed with a first base body plate 10A and a second base body plate 10B. The first base body plate 10A has on its upper side protruding upper burls 11, the even end faces 12 of which span a burls support plane for a silicon wafer 1. The second base body plate 10B contains tempering medium lines 16 and it is, for example, configured as described in U.S. Pat. No. 9,673,079 B1. U.S. Pat. No. 9,673,079 B1 is introduced by reference into the present description, in particular with regard to the structure of the base body and the connection of the holding apparatus to a voltage source. FIG. 2 shows a portion of a holding apparatus 100 with further details and, in particular, with an optionally provided cover layer 17 on the burls 11.

The burls 11 have, for example, the form of cuboids, cylinders, pyramids, cones, truncated pyramids and/or truncated cones, preferably with a height in the range of 100 µm to 300 µm, in particular 200 µm to 250 µm, a diameter in the range of 50 µm to several mm and a mutual spacing from one to several mm. In a practical example, 40,000 burls 11 are provided on the first base body plate 10A. The burl bottom 14 between the burls 11 can be roughened.

The electrode device 20 comprises a layered structure with a lower insulator layer 21, a middle electrode layer 22 and an upper dielectric layer 23. The insulator layer 21 is formed with a thickness of, for example 30 µm to 100 µm from an inorganic dielectric, for example, Borofloat glass. The electrode layer 22 comprises at least one electrode which is connected via a conductor path to a voltage source (not shown). The electrode layer 22 is formed, for example, from polycrystalline silicon, gold, chromium or aluminum with a thickness of, for example, 300 nm. The configuration of the at least one electrode with lateral insulation sections 25 takes place, for example, using a locally selective deposition method (in particular vapor deposition making use of masks) and/or a subsequent etching method and/or a thermal conversion into an insulating material (see FIG. 3B). The dielectric layer 23 is formed from an alkali ion-free glass, for example, Eagle XG glass (product identification) with a thickness in the range of 50 µm to 200 µm, in particular 110 µm.

The electrode device 20 has openings 24, the extent of which along the electrode device 20 is greater than the diameter of the burls 11 and through which the burls 11 extend. Between the inner edges of the electrode device 20 at the openings 24 and the burls 11, a spacing is formed. For this purpose, the openings 24 have an extent which is, for example, 30 µm to 100 µm greater than the diameter of the buds 11. The openings 24 are, for example, circular with a diameter of 600 µm to 800 µm.

The electrode device 20 is connected to the base body by means of an adhesive 13. The adhesive 13 comprises a plastics material which, by means of the provision of solvents and/or by a temperature setting and/or by an irradiation, for example IR irradiation, and/or a temperature-induced polymerization, can be liquid or flowable or paste-like and can be transformed to the solid state by means of solvent removal and/or tempering and/or irradiation with, for example, UV light. The plastics material is electrically insulating so that preferably no, or only a negligibly small, electrical leakage current from the electrode device 20 to the base body 10 occurs. Furthermore, the plastics material preferably has no or, for the application, a negligible curing shrinkage and/or no or, for the application, a negligible moisture uptake/loss. A preferred example of a plastics for the insulator layer 21 is BCB or prepolymerized BCB. The thickness of the layer of plastics 13 between the insulator layer 21 and the burl bottom 14 is, for example, 20 µm to 30 µm.

The overall thickness of the electrode device 20 is selected so that between the upper side of the dielectric layer 23 and the burls support plane, a gap spacing A in the range, for example, of 5 µm to 20 µm is formed. The gap spacing A is constant over the whole area of the holding apparatus 100. The setting of the gap spacing A takes place by means of the embedding of the electrode device 20 into the adhesive 13 with the method illustrated in FIGS. 3 and 4.

A section of a holding apparatus 100 in the surroundings of a single burl 11 shows in FIG. 2 additional optionally provided layers, comprising the cover layer 17 and an adhesion promoting layer 26. The cover layer 17 is provided, for example, from DLC with a thickness of, for example, 500 nm on the end faces 12 of the burls 11 and in their surroundings until the dielectric layer 23. By means of the cover layer 17, an effective gap spacing A* is formed which, due to the even deposition of the cover layer 17 on all the burls 11, is constant over the entire surface of the holding apparatus 100.

Figure 3:
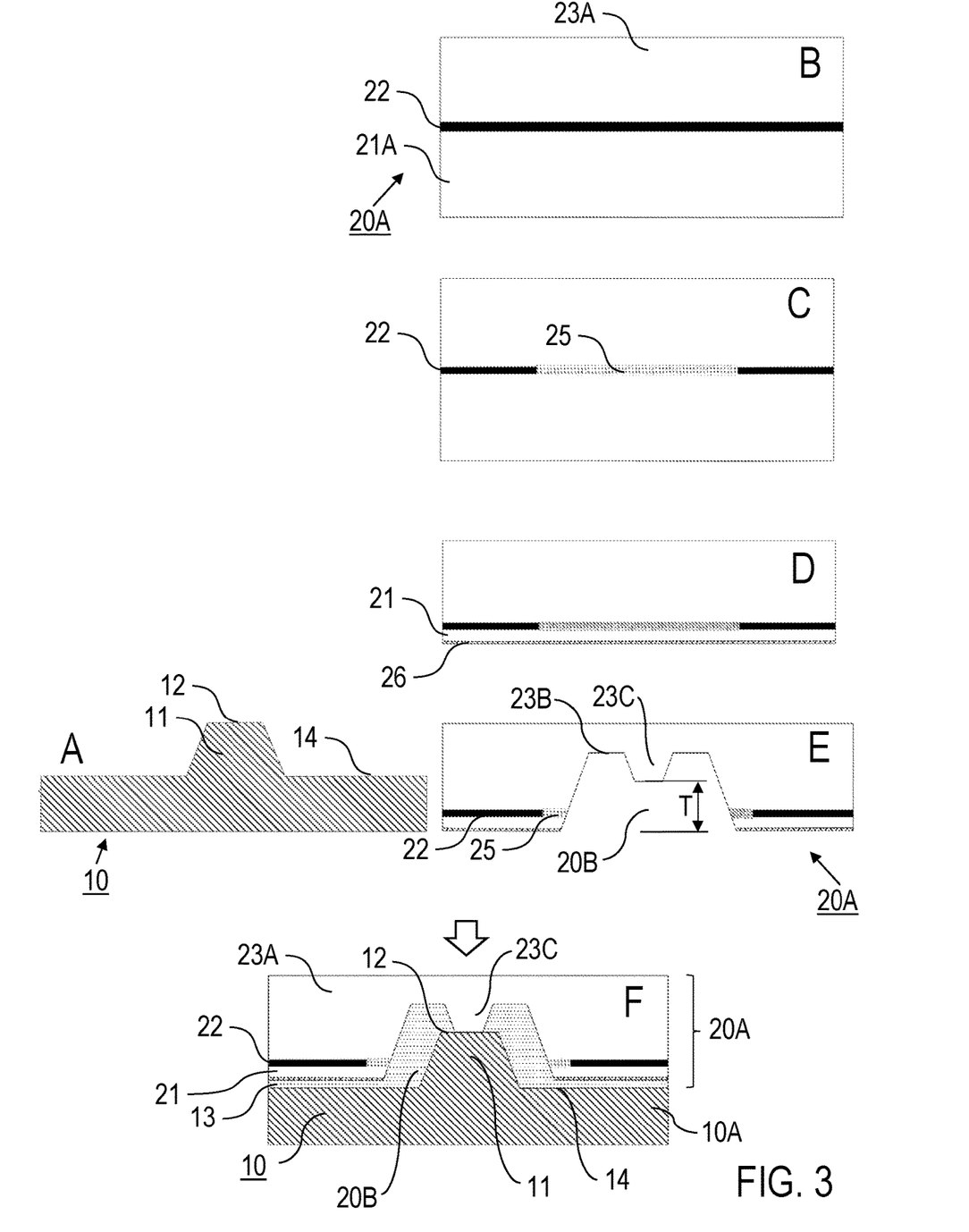
FIG. 3 a schematic illustration of a first sequence of steps in the production of the holding apparatus in accordance with the method according to the invention.
Figure 4:
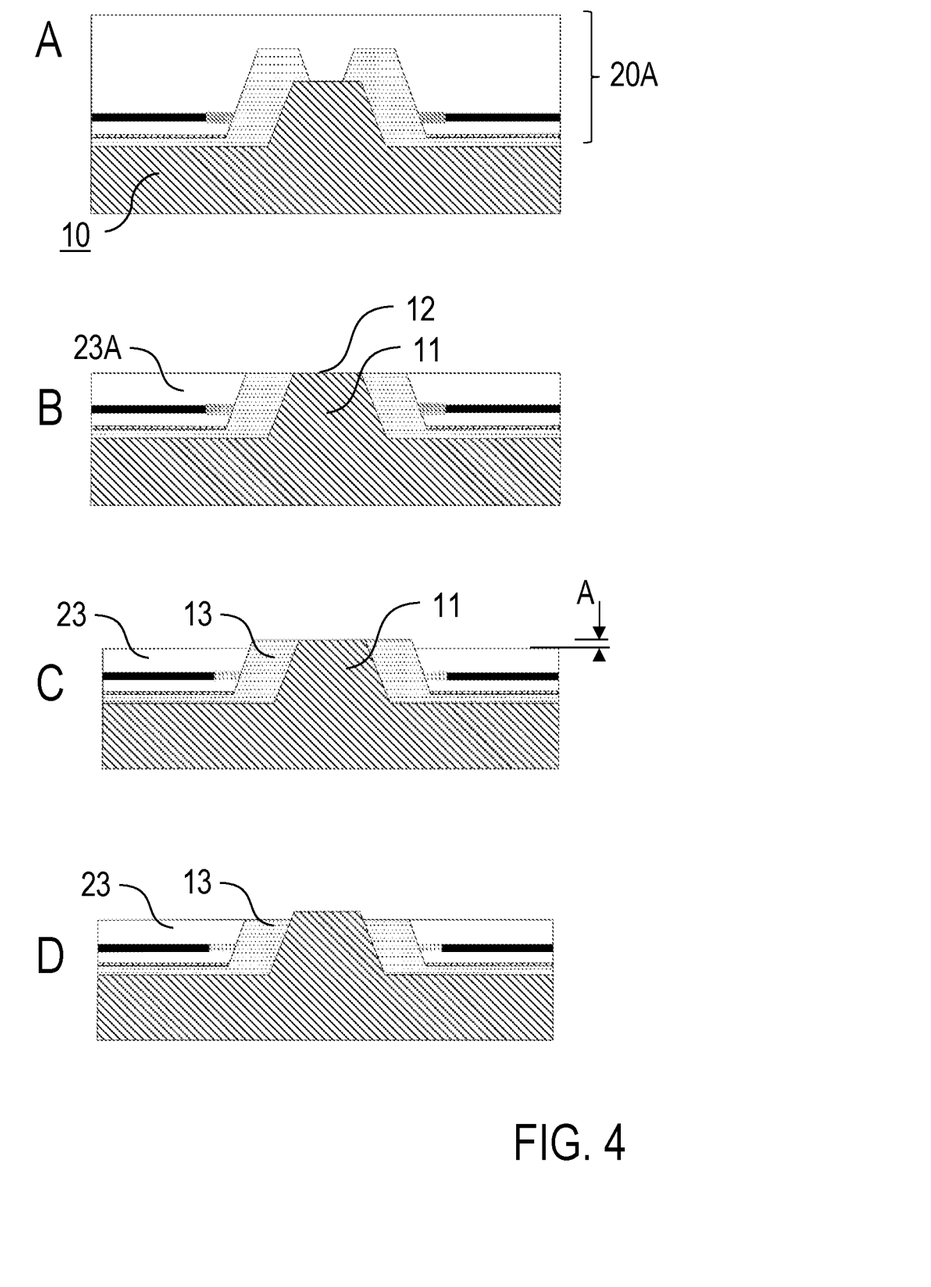
FIG. 4 a schematic illustration of a second sequence of steps in the production of the holding apparatus according to the method according to the invention.

The production of the holding apparatus 100 according to FIG. 1 or 2 is illustrated in FIGS. 3 and 4 on the basis of a single burl 11, although in practice it is carried out on all the burls simultaneously. For the production of the holding apparatus, firstly, according to FIGS. 3A and 3B to 3E, the base body 10 and a composite 20A of a planar insulator disk 21A, the electrode layer 22 and the planar dielectric disk 23A are produced or provided separately from one another. The production of the base body 10 (FIG. 3A) takes place according to US 2016/0354864, in particular with the provision of a ceramic plate 10A (see FIG. 1) with the protruding burls 11. On the burl bottom 14, the base body 10 is roughened and/or provided with a SiC enrichment, whereby advantageously the adhesion of the insulator layer 21 (FIG. 3F) is favored. The burls 11 have planar end faces 12, which span the burls support plane. The burls support plane 14 extends parallel to the burl bottom 14 between the burls 11. Advantageously, the perpendicular distance between the burls support plane and the burl bottom is settable with a high level of accuracy (better than 1 to 2 µm). The end faces 12 can have a surface roughness.

For the production of the composite 20A from glass sheets, according to FIG. 3B, initially the insulator disk 21A and the dielectric disk 23A with the electrode layer 22 arranged therebetween are bonded by anodic bonding. The electrode layer 22 forms the electrode of the holding apparatus later. The insulator disk 21A is a shape-holding, self-supporting plate of glass, for example, Borofloat glass with a constant thickness of, for example, 1 mm. The dielectric disk 23A is also a shape-holding, self-supporting plate of glass, for example, of the Eagle XG type or Schott AF 32 (product designations) with a constant thickness of, for example, 1 mm. The dielectric disk 23A carries the electrode layer 22 on one side. The electrode layer 22 comprises, for example, Cr or Al, in particular with a thickness in the range of 100 nm to 500 nm.

In the next step according to FIG. 3C, the electrode structure is introduced into the plane of the electrode layer 22. In the preferably used method which is described in US 2012/0 236 458 A1, the electrode layer 22 is converted in a targeted manner by a laser radiation, so that insulation sections 25 are formed. The conversion of the electrode layer 22 takes place in a locally delimited manner such that, after the later deepening of depressions into the composite 20A (see FIG. 3E) on the inner edges of the electrode layer 22, the insulation sections 25 are formed on all sides. US 2012/0 236 458 A1 is introduced by reference into the present description in relation to the conversion of a metal layer embedded between dielectrics to an electrically insulating portion.

Subsequently, the insulator disk 21A is thinned to form the insulator layer 21 according to FIG. 3D by lapping and polishing parallel to the electrode layer 22, for example, to the desired thickness of 30 µm to 100 µm. Preferably, the surface of the insulator layer 21 is provided with an adhesion promoter layer 26 in order to achieve an optimum adhesion during the later joining process. Alternatively or additionally, a roughening of the surface can be provided. The adhesion promoter layer 26 comprises, for example, $Si_3N_4$ or SiC, in particular, with a thickness in the range of 10 nm to 1 µm.

The following structuring of the composite 20A (FIG. 3E) and the joining with the base body 10 (FIG. 3F) comprise the following steps.

According to FIG. 3E, depressions 20B which extend through the insulator layer 21 and the electrode layer 22 as far as into the dielectric disk 23A are sunk into the composite 20A. Bottom surfaces 23B of the depressions 20B preferably have projections 23C, each with a planar end face ("counter-burls") parallel to the extent of the dielectric disk 23A. The provision of the counter-burls has the advantage that additional volume is created for the accommodation of plastics material. The counter-burls can be larger, the same size or smaller than the burls of the base body. A further substantial advantage of the counter-burls arises in the mechanical thinning (FIG. 4B) of the dielectric disk 23A in that the depressions 20B are opened at the positions of the burls 11 before the dielectric disk 23A is thinned to the plane of the end faces 12 of the burls 11. By this means, it is possible, during the remaining processing that has still to be carried out, i.e. until the burl plane is reached, to remove scratches on the surface of the dielectric caused by material fragments during the opening of the depressions 20B.

The arrangement of the depressions 20B in the composite 10A is the same as the arrangement of the burls 11 of the base body 10. The diameters of the depressions 20B are, for example, 30 μm to 100 μm greater than the largest diameter of the burls 11. The size of the end faces of the projections 23C can (as shown) be smaller than the size of the end faces 12 of the burls 11. Advantageously, in this case, the contact area between the burls 11 and the dielectric disk 23A is minimized. Alternatively, both end faces can have the same size or the end faces 12 can be smaller than the end faces of the projections 23C. The bottom surfaces 23B of the depressions 20B and/or the end faces of the optionally provided projections 23C lie in a plane parallel to the electrode layer 22 and serve during later gluing as a reference plane for aligning the planar electrode layer 22 parallel to the burls support plane of the base body 10.

A depth measure T, i.e. the perpendicular distance of the end faces of the projections 23C from the lower surface of the composite 20A is selected dependent upon the height of the burls 11. The depth measure T is selected, in particular, such that if the projections 23C lie on the burls 11, between the composite 20A and the burl bottom 14, a distance for the uptake of the adhesive 13 remains between the insulator layer 21 (possibly with the adhesion promoter layer) and the burl bottom 14. The production of the structured composite 20A takes place, for example, by means of laser ablation, wherein the depth measure T is advantageously settable with an accuracy of better than 1 μm.

In the state shown in FIG. 3E, the composite 20A as such already forms an electrostatic clamp although it is not yet complete for practical use, but can already be tested by reference. For this purpose, the electrode layer 22 can be connected via a bore to a voltage source and tested in its function before the subsequent joining step.

Subsequently, according to FIG. 3F, the joining of the composite 20A to the base body 10 takes place, wherein an alignment of the dielectric disk 23A relative to the burls support plane is provided with the setting of the gap spacing A, advantageously without a reference tool. The structured dielectric disk 23A forms a reference, as described in the following.

In a preparation step, a layer of liquid adhesive 13 is applied to the surface of the base body plate 10A of the base body with the burls 11 and/or onto the structured lower surface of the composite 20A. The adhesive is, for example, the polymer BCB in a liquid state, and adjusted, for example, with a solvent. After the coating, the solvent is removed by heating the base body plate 10A and/or the composite 20A, for example, in an oven so that the remaining plastics layer is solid, but still ductile. In this state, both of the joining partners can be aligned with one another and placed onto one another.

Subsequently, the composite of the base body plate 10A and the composite 20A are subjected to a negative pressure, for example, in a vacuum oven. Air inclusions, for example, in the adhesive or in the remaining material are removed through the action of the negative pressure.

Thereafter, while maintaining the negative pressure, the temperature is raised so that the adhesive becomes liquid. For example, at a temperature of approximately 150° C., the plastics material BCB is similarly liquid like water. If the plastics material is molten, the composite 20A rests floating on the burls 11. For the correct alignment of the composite 20A in the lateral direction, i.e. parallel to the burls support plane, lateral mechanical stops can be provided at the edge of the base body (not shown) and/or an adjusting device can be provided for positioning the composite 20A in the lateral direction, for example, with a control loop using an optical measuring device. The bonding partners are pressed together with a weight or a translation mechanism (see arrow in FIG. 3F), wherein the projections 23C lie directly on the end faces 12 of the burls 11, so that the plane of the electrode layer 22 is precisely aligned to the plane which is generated by the end faces 12. The composite 20A is pressed into the adhesive layer, wherein the adhesive is forced in lateral directions and into the depression 20B. After the pressing of the bonding partners, the temperature is increased so that the plastics material hardens and the composite 20A is firmly connected to the base body plate 10A.

Subsequently, the further processing steps illustrated schematically in FIGS. 4A to 4E take place for setting the gap spacing A. FIG. 4A shows the state of the base body 10 and of the composite 20A according to FIG. 3F after the joining. Firstly, an erosion of the dielectric disk 23A takes place according to FIG. 4B, until the end faces 12 of the burls 11 are uncovered. This removal preferably takes place by means of an abrasive method such as lapping and/or polishing. Since the material of the dielectric disk 23A is softer than the material of the burls 11, the burls 11 can be used directly as a reference during the erosion of the dielectric disk 23A. The dielectric disk 3A is thinned evenly until the end faces 12 of the burls 11 are uncovered (FIG. 4B).

Thereafter, according to FIG. 4C, a selective etching of the material of the dielectric disk takes place for the production of the dielectric layer 23 with the adjusting of the gap spacing A. The etching takes place by means of wet chemical etching with HF or by dry etching. Thereby, the gap spacing A is advantageously adjustable with an accuracy of less than 200 nm. The etching does not act upon the protruding cured adhesive 13, so that the burl 11 remains embedded laterally in the plastics material 13.

Thereafter, according to FIG. 4D, optionally a removal of the—remaining plastics material 13 can take place, to the level of the upper side of the dielectric layer 23. The removal takes place, for example, by means of mechanically acting methods, chemical processes or laser ablation.

Finally, a cover layer 17 can be applied as a wear protection layer made of DLC, as shown in FIG. 2.

The production of a holding apparatus provided on both sides with burls and each with an electrode device can take place such that firstly base body plates (e.g. 10A; see FIG. 1) are provided with the electrode device 20 and are subsequently connected to the base body 10.

Alternatively, it would also be possible, in order to join the two base body plates to one another, to structure both sides with burls and, subsequently, successively or simultaneously to cement a composite according to the composite 20A in FIG. 3E onto the respective side and to process it, according to FIG. 4, to form the electrode devices.

The features of the invention disclosed in the above description, the drawings and the claims can be significant either individually or in combination or in sub-combination for the realization of the invention in its various embodiments.

What is claimed is:

1. A holding apparatus configured for electrostatic holding of a component, comprising:
   a base body with at least one base body plate,
   a plurality of protruding burls which are arranged on an upper side of the base body plate and end faces of which span a burls support plane for a support of the component, and
   an electrode device which is arranged in layered form in spacings between the burls and has an insulator layer which is connected to the base body plate, an electrode layer and a dielectric layer made from an inorganic dielectric, wherein the electrode layer is arranged between the insulator layer and the dielectric layer, wherein
   a pre-determined gap spacing is set between the burls support plane and an upper side of the dielectric layer, and
   the electrode device has a plurality of openings and is arranged on the upper side of the base body plate between the burls such that the burls protrude through the openings, wherein
   the insulator layer comprises an inorganic dielectric and is connected with an adhesive to the upper side of the base body between the burls, and
   the electrode device is embedded in the adhesive, and in the openings, a spacing between the burls and the electrode device is filled with the adhesive.

2. The holding apparatus according to claim 1, wherein a surface of the adhesive and of the dielectric layer are formed aligned with one another between the burls, so that the gap spacing is formed between the burls support plane and a surface of the adhesive and the dielectric layer.

3. The holding apparatus according to claim 1, wherein the adhesive comprises at least one of benzocyclobutene, prepolymerized benzocyclobutene, a parylene plastics material, a polyimide plastics material and a polyethylene terephthalate plastics material.

4. The holding apparatus according to claim 1, wherein the electrode layer is separated from the openings by insulation sections.

5. The holding apparatus according to claim 1, wherein the base body plate comprises SiSiC or SSiC ceramic material.

6. The holding apparatus according to claim 1, wherein the burls are integrally connected to the base body plate.

7. The holding apparatus according to claim 1, wherein the electrode layer comprises a metal, a metal alloy, a semiconductor material or an electrically conductive ceramic material.

8. The holding apparatus according to claim 7, wherein the electrode layer comprises at least one of chromium, titanium and aluminum.

9. The holding apparatus according to claim 1, being configured for the electrostatic holding of a semiconductor wafer.

10. A method for producing a holding apparatus configured for electrostatic holding of a component, comprising the steps:
    producing a base body which has at least one base body plate and a plurality of protruding burls which are arranged on an upper side of the at least one base body plate and end faces of which generate a burls support plane for supporting the component,
    producing an electrode device which comprises a layered structure of an insulator layer and a dielectric layer with an electrode layer which is arranged between the insulator layer and the dielectric layer, wherein the electrode device has openings for receiving the burls, and
    connecting the electrode device to the base body, wherein burls protrude through the openings in the electrode device, wherein the method further comprises the steps:
    producing a composite from an insulator disk, which is provided for the formation of the insulator layer, and a dielectric disk which is provided for the formation of the dielectric layer, with the electrode layer arranged between the insulator disk and the dielectric disk, with a deepening of depressions through the insulator disk as far as into the dielectric layer, wherein the depressions are provided for forming the openings,
    applying an adhesive onto the upper side of at least one of the at least one base body plate and the insulator disk,
    placing the composite of the dielectric disk and the insulator disk onto the base body so that the burls protrude into the depressions through the insulator disk, and the dielectric disk lies in the depressions on the end faces of the burls, with a joining of the dielectric disk and the insulator disk to the base body, and
    thinning of the dielectric disk in order to form the dielectric layer, wherein
    the electrode device is embedded in the adhesive and in the openings a spacing between the burls and the electrode device is filled with the adhesive.

11. The method according to claim 10, wherein the production of the composite of the insulator disk and the dielectric disk comprises the steps:
    joining the insulator disk and the dielectric disk to the electrode layer arranged therebetween, and
    thinning the insulator disk in order to form the insulator layer.

12. The method according to claim 10, further comprising the step of converting the electrode layer in the surroundings of the openings into insulation sections, so that the electrode layer is electrically insulated from the openings by the insulation sections.

13. The method according to claim 10, wherein the thinning of the dielectric disk comprises:
    thinning the dielectric disk by lapping and polishing until the end faces of the burls are uncovered, and
    further thinning the dielectric disk by etching until a pre-determined gap spacing is formed between the burls support plane and the surface of the dielectric layer.

14. The method according to claim 13, further comprising the step of removing material from the adhesive in the spacing between the burls and the electrode device until surfaces of the adhesive and of the dielectric layer are formed aligned with one another between the burls.

15. The method according to claim 10, wherein a holding apparatus is produced which is configured for the electrostatic holding of a semiconductor wafer.

* * * * *